United States Patent
Hendriks et al.

(10) Patent No.: US 10,349,525 B2
(45) Date of Patent: Jul. 9, 2019

(54) SUBSTRATE COMPRISING AN ELECTRICAL CIRCUIT PATTERN, METHOD AND SYSTEM FOR PROVIDING SAME

(71) Applicant: Nederlandse Organisatie voor toegepast-natuurwetenschappelijk onderzoek TNO, s-Gravenhage (NL)

(72) Inventors: Rob Jacob Hendriks, s-Gravenhage (NL); Edsger Constant Pieter Smits, s-Gravenhage (NL); Sandeep Menon Perinchery, s-Gravenhage (NL); Pim Groen, s-Gravenhage (NL)

(73) Assignee: Nederlandse Organisatie voor toegepast-natuurwetenschappelijk onderzoek TNO, 's-Gravenhage (NL)

( * ) Notice: Subject to any disclaimer, the term of this patent is extended or adjusted under 35 U.S.C. 154(b) by 82 days.

(21) Appl. No.: 15/032,929

(22) PCT Filed: Oct. 29, 2014

(86) PCT No.: PCT/NL2014/050747
§ 371 (c)(1),
(2) Date: Apr. 28, 2016

(87) PCT Pub. No.: WO2015/065181
PCT Pub. Date: May 7, 2015

(65) Prior Publication Data
US 2016/0270236 A1    Sep. 15, 2016

(30) Foreign Application Priority Data

Oct. 30, 2013 (EP) .................................. 13190953
Dec. 16, 2013 (EP) .................................. 13197496

(51) Int. Cl.
| | |
|---|---|
| G03F 7/34 | (2006.01) |
| H05K 3/02 | (2006.01) |
| G03F 7/09 | (2006.01) |
| G03F 7/11 | (2006.01) |
| B05D 3/06 | (2006.01) |
| H05K 1/02 | (2006.01) |
| H05K 3/00 | (2006.01) |

(52) U.S. Cl.
CPC .............. H05K 3/027 (2013.01); B05D 3/06 (2013.01); G03F 7/092 (2013.01); G03F 7/11 (2013.01);
(Continued)

(58) Field of Classification Search
CPC ... G03F 7/11; G03F 7/34; G03F 7/343; G03F 7/092
(Continued)

(56) References Cited

U.S. PATENT DOCUMENTS

| | | |
|---|---|---|
| 4,247,619 A | 1/1981 | Cohen et al. |
| 4,284,703 A | 8/1981 | Inoue et al. |

(Continued)

FOREIGN PATENT DOCUMENTS

| | | | |
|---|---|---|---|
| EP | 0096572 A2 | 12/1983 | |
| EP | 0727321 A1 | 8/1996 | |

(Continued)

OTHER PUBLICATIONS

Feb. 2, 2015—International Search Report and Written Opinion of PCT/NL2014/050747.

*Primary Examiner* — Daborah Chacko-Davis
(74) *Attorney, Agent, or Firm* — Banner & Witcoff, Ltd.

(57) ABSTRACT

The present disclosure concerns an electrical circuit pattern on a substrate, as well as a method and system for forming same. In a typical embodiment, a light pattern is projected through a transparent layer to cause a patterned release of adhesion between a continuous material layer and the transparent layer. A release layer adhered to the patterned material layer is pulled off the substrate to separate the material having lower adhesion while leaving the material that was not exposed to form the electrical circuit pattern thereon.

20 Claims, 2 Drawing Sheets

(52) U.S. Cl.
 CPC ............... *G03F 7/34* (2013.01); *G03F 7/343* (2013.01); *H05K 1/0296* (2013.01); *H05K 3/0082* (2013.01); *H05K 2201/0108* (2013.01); *H05K 2203/0104* (2013.01); *H05K 2203/0522* (2013.01)

(58) Field of Classification Search
 USPC .......................................... 430/258, 15, 158
 See application file for complete search history.

(56) References Cited

U.S. PATENT DOCUMENTS

| | | | |
|---|---|---|---|
| 5,527,660 A | | 6/1996 | Teng |
| 5,691,103 A | * | 11/1997 | Takeyama .............. B41M 5/368 428/143 |
| 2007/0014934 A1 | * | 1/2007 | Goulding ............... C09K 19/32 428/1.1 |
| 2012/0168215 A1 | * | 7/2012 | Shiina .................... H05K 3/287 174/258 |

FOREIGN PATENT DOCUMENTS

| | | | |
|---|---|---|---|
| EP | 0836892 A2 | 4/1998 | |
| EP | 0727321 B1 * | 5/2001 | ........... B41M 5/368 |
| GB | 2021276 | 11/1979 | |
| JP | S52-126220 | 10/1977 | |
| JP | S53-065733 | 6/1978 | |
| JP | S53-003215 | 12/1978 | |
| JP | S55-011280 | 1/1980 | |
| JP | S57-029042 | 2/1982 | |
| JP | S62-065046 | 3/1987 | |
| JP | H10-039519 | 2/1998 | |

* cited by examiner

SUBSTRATE COMPRISING AN ELECTRICAL CIRCUIT PATTERN, METHOD AND SYSTEM FOR PROVIDING SAME

CROSS-REFERENCE TO RELATED APPLICATIONS

This application is a U.S. National Stage application under 35 U.S.C. § 371 of International Application PCT/NL2014/050747 (published as WO 2015/065181 A1), filed Oct. 29, 2014, which claims priority to Application EP 13190953.3, filed Oct. 30, 2013, and to Application EP 13197496.6, filed Dec. 16, 2013. Benefit of the filing date of each of these prior applications is hereby claimed. Each of these prior applications is hereby incorporated by reference in its entirety.

TECHNICAL FIELD AND BACKGROUND

The present disclosure concerns a method and system for forming a patterned structure on a substrate, and the resulting product substrate.

Photolithography and etching processes are often used to pattern thin metal layers on flexible substrates. In photolithography, a polymer can be coated onto the metal film and patterned via UV-light. The metal which is not covered by the polymer is etched away. However, as these techniques are relatively slow, they do not bring the optimal solution for high volume roll-to-roll processing. In printing, conductive inks can be printed in a patterned way via inkjet, (rotary) screen, flexo, gravure, etc. However, as these inks are particle based, a post-treatment step is needed obtain conductivity. In laser ablation, laser systems can be used for ablating and patterning of various materials. However, ablating the metal layer may use a relatively high amount energy.

Accordingly, there is a desire for an improved method and system for providing an electrical circuit pattern on a substrate.

SUMMARY

A first aspect of the present disclosure provides a method for forming an electrical circuit pattern on a substrate, the method comprising providing a stack comprising a continuous material layer adhered between a release layer on one side and a transparent layer on the other side, wherein the continuous material layer is a continuous metal layer or a continuous layer of semiconductor material; providing a light source projecting light onto the stack from the side of the transparent layer; and providing a mask between the light source and the stack to pattern the projected light onto the stack, wherein the light pattern is projected through the transparent layer to cause a patterned release of adhesion between the continuous material layer and the transparent layer at locations matching the projected light pattern.

By selectively irradiating an adhesion between layers, a patterned release of the adhesion can be effectuated. By having a patterned release of adhesion between layers, one or both of said layers can be patterned. By having a release layer adhered on one side of the layer to be patterned, the patterned release can be better controlled. By irradiating through a transparent substrate, the adhesion layer is accessible, e.g. as opposed to irradiation from a side of the adhesion layer covered by material of the layer to be structured, e.g. metal. For example, the light pattern can be projected through transparent material of the stack onto the adhesion layer and/or continuous material layer thereby indirectly heating adjacent layers to causes the release of adhesion. The present methods and system can be used roll to roll in high volume, e.g. by using a flexible substrate and/or release layer. The technique is particularly suitable for providing high quality metal layers and semiconductor layers. This technique does not require time consuming post-treatment steps such as sintering or etching. In contrast with the traditional photo-lithographic process, this method can use a short and high intensity pulse in order to pattern. For example, a flash lamp can be used to cause the release of adhesion. Accordingly, the present method provides improved patterning of structures on substrates.

Surprisingly, it is discovered that the method is applicable to pattern layers of metal or semiconductor material to thereby form an electrical circuit on substrate. The prior art EP0727321, U.S. Pat. No. 5,527,660, EP0096572, U.S. Pat. No. 4,247,619 describes image forming materials and methods, but not forming an electrical circuit pattern from a continuous metal layer or a continuous layer of semiconductor material as described herein.

In one embodiment, the method comprises separating the release layer from the transparent layer, wherein during the separating, a pattern formed in the continuous material layer adheres to the transparent layer at locations where the adhesion between the continuous material layer and the transparent layer was not released by the projected light pattern, and a reciprocal pattern formed in the continuous material layer adheres to the release layer at locations where the adhesion between the continuous material layer and the transparent layer was released by the projected light pattern.

In one embodiment, the continuous layer is a conductive or semi-conductive layer. By using a conductive layer, conductive structures or patterns can be formed, e.g. circuitry. For example the continuous layer can be a metal layer. Advantageously, the patterned metal layer can provide a conductive structure.

In one embodiment, the patterned continuous material layer on the substrate is formed by the continuous material layer adhering to the transparent layer after exposure to the patterned light. In one embodiment, the transparent layer comprises polymer film or glass substrate to form the substrate. Alternatively or in addition, the patterned continuous material layer on the substrate is formed by the continuous material layer adhering to the release layer. For example, the release layer can comprise a polymer film that forms a functional substrate with the patterned continuous material layer thereon. Preferably, at least part of the stack is flexible to allow the process to be performed roll-to-roll.

Adhesion can be released by a selective reaction of material between the transparent layer and continuous material layer. The reacted material may comprise part of the substrate and/or a separate adhesion layer. In one embodiment, the stack comprises an intermediate adhesion layer between the transparent layer and the continuous material layer. For example, the stack comprises a polymer adhesion layer between the transparent layer and the continuous material layer, wherein the polymer adhesion layer comprises a decomposable material that selectively decomposes upon irradiation by the projected light pattern to decrease the adhesion between the continuous material layer and the transparent layer. In one embodiment, the transparent layer comprises a polymer film wherein the polymer film comprises a decomposable material that selectively decomposes upon irradiation of the adjacent continuous material layer by the projected light pattern to decrease the adhesion between the continuous material layer and the transparent layer.

By using a decomposable material, an adhesion between the transparent substrate and continuous material layer can be advantageously released. For example, by using a high intensity flash lamp, metal grids can be patterned within milliseconds without the use of etching solutions. Evaporated or sputtered metals on polymer films can be patterned by means of a high intensity light pulse. The light which is not blocked by the mask can generate a lot of heat at the interface of the metal and (polymer) substrate. Due to this heat (e.g. ≥400° C.), the polymer decomposes and the adhesion from the metal to the substrate can decrease significantly. Afterwards, the residual metal is removed by the release liner. Also other ways of releasing an adhesion can be envisaged, e.g. melting.

By using a continuous material layer that absorbs the radiation, the adjacent layers can be indirectly heated, e.g. resulting in decomposition or other mechanisms of release. Accordingly, preferably a continuous material layer is used that has a relatively high absorption for the irradiation light. For example, copper can be very suitable for this and other reasons.

To allow a relatively smooth release of the continuous material layer without tearing, preferably the continuous material layer is not too thick. Accordingly, preferably, the continuous material layer has a layer thickness of less than 1000 nm, preferably less than 500 nm, or even thinner.

In one embodiment, the light source produces a light pulse shorter than 2 ms, preferably shorter that 1 ms. Shorter light pulses can have more energy per unit of time, which can be advantageously used e.g. to decompose an adhesion layer. Preferably, the light source produces a pulse energy of more than 5 J/cm2, preferably more than 10 J/cm2.

In one embodiment, the light source comprises a Xenon flash lamp. Although laser systems are suitable, flash lamp are cheaper and can be used to pattern large areas. It is noted that most high powered flash lamp systems (e.g. Xenon Sinteron®, NovaCentrix Pulseforge®) are designed for annealing conductive inks and ceramic materials. Furthermore, traditionally, only top illumination is used.

Preferably, the mask is resistant to the irradiation light, e.g. does not deteriorate after exposure. For example, in one embodiment, the mask comprises a metal on glass. Suitable metals may include aluminium, chrome, or other metals that on the one hand provide sufficient masking capability and on the other hand sufficient resistance to deterioration.

In one embodiment, the system comprises a release mechanism for separating the release layer from the transparent layer, wherein during the separating, a pattern formed in the continuous material layer adheres to the transparent layer at locations where the adhesion between the continuous material layer and the transparent layer was not released by the projected light pattern, and a reciprocal pattern formed in the continuous material layer adheres to the release layer at locations where the adhesion between the continuous material layer and the transparent layer was released by the projected light pattern.

In one embodiment, the means for providing a stack comprises a substrate transporter arranged for transporting a transparent substrate; continuous material layer deposition means arranged for depositing the continuous material layer onto the transparent substrate; and release liner application means arranged for laminating the release layer onto the continuous material layer.

A second aspect of the present disclosure provides a system for forming an electrical circuit pattern on a substrate, the system comprising means for providing a stack comprising a continuous material layer adhered between a release layer on one side and a transparent layer on the other side, wherein the continuous material layer is a continuous metal layer or a continuous layer of semiconductor material; and a light source arranged for projecting light onto the stack from the side of the transparent layer; a mask between the light source and the stack to pattern the projected light onto the stack, wherein the light pattern is projected through the transparent layer to cause a patterned release of adhesion between the continuous material layer and the transparent layer at locations matching the projected light pattern. The system may be equipped to carry out the method according to the first aspect.

A third aspect of the present disclosure provides a substrate comprising an electrical circuit pattern obtainable by a method or system as described herein, the substrate comprising a transparent layer, wherein a patterned metal or semi-conductor material forming the circuit pattern is adhered to the transparent layer by means of an adhesion layer therein between, wherein parts of the adhesion layer are decomposed and/or melted at locations where the patterned material has been removed. Typically, the patterned material may comprise a tearing edge resulting from the removing of material at the said locations by means of pulling a release layer off a continuous material layer that is selectively adhered to the transparent layer.

Further advantages and applications of the present methods and systems may include suitability for high speed processing, compatibility with roll-to-roll, large area patterning, low cost, no need for expensive (nano)particle inks, cheap RFID antenna structures.

BRIEF DESCRIPTION OF DRAWINGS

These and other features, aspects, and advantages of the apparatus, systems and methods of the present disclosure will become better understood from the following description, appended claims, and accompanying drawing wherein:

DESCRIPTION OF EMBODIMENTS

Figure 1:
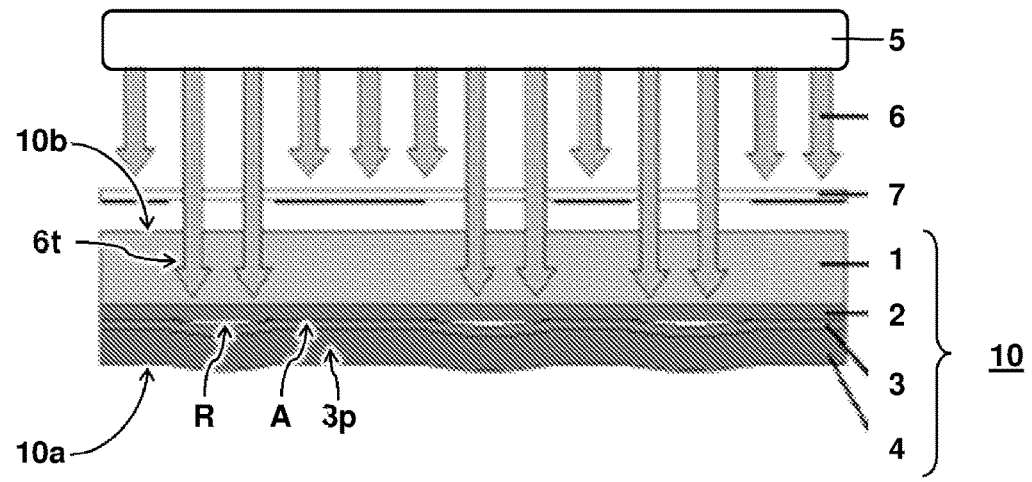
FIG. 1 schematically illustrates a first stage in a method for forming a patterned structure on a substrate.

Unless otherwise defined, all terms (including technical and scientific terms) used herein have the same meaning as commonly understood by one of ordinary skill in the art to which this invention belongs as read in the context of the description and drawings. It will be further understood that terms, such as those defined in commonly used dictionaries, should be interpreted as having a meaning that is consistent with their meaning in the context of the relevant art and will not be interpreted in an idealized or overly formal sense unless expressly so defined herein. In some instances, detailed descriptions of well-known devices and methods may be omitted so as not to obscure the description of the present systems and methods. Terminology used for describing particular embodiments is not intended to be limiting of the invention. As used herein, the singular forms "a", "an" and "the" are intended to include the plural forms as well, unless the context clearly indicates otherwise. The term "and/or" includes any and all combinations of one or more of the associated listed items. It will be understood that the terms "comprises" and/or "comprising" specify the presence of stated features but do not preclude the presence or addition of one or more other features. It will be further understood that when a particular step of a method is referred to as subsequent to another step, it can directly follow said other step or one or more intermediate steps may be carried out before carrying out the particular step, unless specified otherwise. Likewise it will be understood that when a connection between structures or components is described, this connection may be established directly or through intermediate structures or components unless specified otherwise. All publications, patent applications, patents, and other references mentioned herein are incorporated by reference in their entirety. In case of conflict, the present specification, including definitions, will control.

In one aspect the present disclosure concerns a patterned structure on a substrate, as well as a method and system for forming same. In a typical embodiment, a light pattern is projected through a transparent layer to cause a patterned release of adhesion between a continuous material layer and the transparent layer. A release layer adhered to the patterned material layer is pulled off the substrate to separate the material having lower adhesion while leaving the material that was not exposed to form the patterned structure thereon.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. The description of the exemplary embodiments is intended to be read in connection with the accompanying drawings, which are to be considered part of the entire written description. In the drawings, the absolute and relative sizes of systems, components, layers, and regions may be exaggerated for clarity. Embodiments may be described with reference to schematic and/or cross-section illustrations of possibly idealized embodiments and intermediate structures of the invention. In the description and drawings, like numbers refer to like elements throughout. Relative terms as well as derivatives thereof should be construed to refer to the orientation as then described or as shown in the drawing under discussion. These relative terms are for convenience of description and do not require that the system be constructed or operated in a particular orientation unless stated otherwise.

FIG. 1 shows an embodiment of a first phase of a method for forming a patterned structure on a substrate. In the shown embodiment, the method comprises providing a stack 10. The stack 10 comprises a continuous material layer 3 adhered between a release layer 4 on one side 10a and a transparent layer 1 on the other side 10b. The method further comprises providing a light source 5 projecting light 6 onto the stack 10 from the side 10b of the transparent layer 1. The method further comprises providing a mask 7 between the light source 5 and the stack 10 to pattern the projected light 6 onto the stack 10. The light pattern 6t is projected through the transparent layer 1 to cause a patterned release of adhesion between the continuous material layer 3 and the transparent layer 1 at locations R matching the projected light pattern 6t. For example, in a method for forming an electrical circuit on a substrate, the continuous material layer 3 may consist of a continuous metal layer or a continuous layer of semiconductor material.

Figure 2:
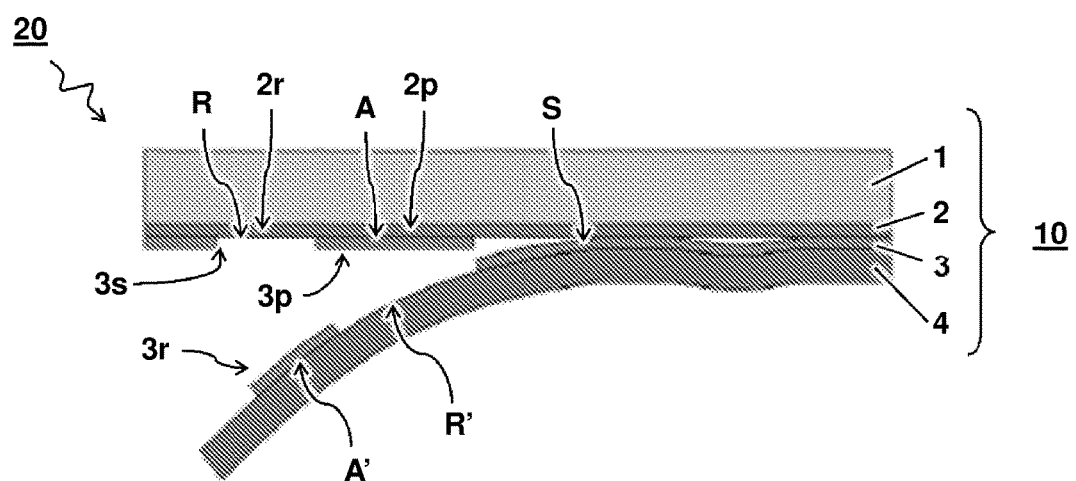
FIG. 2 schematically illustrates a second stage in a method of forming a patterned structure on a substrate.

FIG. 2 shows an embodiment of an optional second phase of the method for forming a patterned structure on a substrate. The embodiment comprises separating the release layer 4 from the transparent layer 1. A pattern 3p formed in the continuous material layer 3 adheres to the transparent layer 1 at locations A where the adhesion between the continuous material layer and the transparent layer was not released by the projected light pattern 6t. A reciprocal pattern 3r formed in the continuous material layer 3 adheres to the release layer 4 at locations A' where the adhesion between the continuous material layer 3 and the transparent layer 1 was released R by the projected light pattern 6t. In one embodiment, the mask 7 comprises a positive image of the circuit pattern. For example, the mask 7 may pass a negative image of the circuit pattern to selectively release the adhesion.

In one embodiment, the patterned structure on the substrate is formed by the patterned continuous material layer 3p remaining adhered A to the transparent layer 1. It will be appreciated that the remaining parts of the continuous material layer 3p have not been subjected to the light pattern 6t which light pattern could possible affect the material layer 3 and/or underlying layers. In another embodiment, the patterned structure on the substrate is formed by the patterned continuous material layer 3r released R from the transparent layer 1 and adhered A' to the release layer 4.

In one embodiment, the continuous material layer comprises a conductive or semi-conductive layer, preferably a metal layer, more preferably a copper layer. For example, the continuous material layer 3 may consist essentially of a continuous metal layer or a continuous layer of semiconductor material. Advantageously, a continuous material layer 3 comprising metal or semiconductor can be used to form electrical circuitry. For example, the patterned conductive material may form conductive tracks of the circuit. Also other electrical circuit patterns may be formed. In one embodiment, the continuous material layer is a continuous and homogeneous conductive or semi-conductive layer. In one embodiment, continuous material layer is homogeneous metal layer. For example, the continuous material layer may be deposited with a metal deposition means.

It will be understood that adhesion between the transparent layer 1 and continuous material layer 3 can be direct or indirect. For example, in one embodiment, the continuous material layer 3 is adhered directly to the transparent layer 1 without intermediate layer. In another embodiment, the transparent layer 1 is adhered to the continuous material layer 3 via an optional intermediate adhesion layer 2.

In one embodiment, the adhesion is released R by a selective reaction of material between the transparent layer 1 and continuous material layer 3. The material can be of the transparent layer 1 itself or of an optional intermediate adhesion layer 2. For example, in one embodiment, the intermediate adhesion layer 2 comprises a polymer adhesion layer. In another embodiment, the transparent layer comprises a polymer film wherein the polymer film comprises a decomposable material that selectively decomposes upon irradiation of the adjacent continuous material layer by the projected light pattern to decrease the adhesion between the continuous material layer and the transparent layer. Also combinations are possible, i.e. wherein both material of the transparent layer 1 and intermediate adhesion layer 2 undergo reaction to release the adhesion.

Adhesion between layers can be effected by various mechanisms, e.g. mechanical, chemical, dispersive, electrostatic, and/or diffusive adhesion. Similarly, the selective release of adhesion can be effectuated in many ways. For example, in one embodiment, material causing or contributing to adhesion can be decomposed in a reaction caused by the light pattern 6t. Also other reaction mechanisms are possible, e.g. melting and/or evaporation of the adhering material. For example, a lowering of viscosity may contribute to lowering of adhesion forces. In one embodiment, a gas forming agent is comprised in an adhesion layer, wherein the gas is formed as a reaction to the light pattern 6t.

The reaction of adhesion material to the light pattern 6t can be triggered in different ways, e.g. by indirect heating of the adhering material. For example, in one embodiment, the light pattern 6t is projected through transparent material of the stack 10 onto the continuous material layer 3 thereby indirectly heating an adjacent transparent layer (e.g. transparent layer 1 or transparent intermediate adhesion layer 2). The indirect heating of the adjacent transparent layer may cause the release of adhesion. To indirectly heat the adjacent layers, preferably, the continuous material layer 3 has a relatively high absorption to the light. For example, in one embodiment, the continuous material layer 3 comprises copper which typically has a relative high absorption e.g. in the visible region 400-1000 nm.

The adhering material can also be directly heated, e.g. in one embodiment, the intermediate adhesion layer 2 is selected to have a high absorption to the light. Alternatively or in addition to reaction by heat, molecules may react to the light directly. For example the adhering material may comprise photo-decomposable material. Additionally or alternatively, a photo-initiator can be provided to initiate a reaction to cause a lowering of the adhesion.

Typically it is desired to provide an adhesion A between the continuous material layer 3 and transparent layer 1 that is higher than the adhesion A' between the continuous material layer 3 and release layer 4 before the reaction caused by the light pattern 6t and lower after said reaction. The release of adhesion A can also be temporary, e.g. long enough to separate the release layer. Preferably, the adhesion of the continuous material layer 3 to the release layer 4 is at least strong enough the overcome shear forces S that may occur during the tearing of the pattern 3r away from the pattern 3p and any forces remaining between the continuous material layer 3 and transparent layer 1 after adhesion has been locally released by the light pattern 6t. It will be appreciated that by pulling the release layer 4 from one side, remaining adhesion, e.g. by 'squeeze-flow' forces between the transparent layer 1 and continuous material layer 3, may be lowered. Advantageously, the release layer 4 can prevent the ablated material 3r from pulling off the remaining structure 3p. Furthermore, it can enable higher resolution.

The release of adhesion between transparent layer 1 and continuous material layer 3 typically comprises a lowering of adhesion forces between said layers (direct or indirect). Adhesion strength of force between layers can e.g. be measured as an energy required to release (separate) a unit area of said layers from each other. In one embodiment, an adhesion strength between the transparent layer 1 and continuous material layer 3 is at least 10% higher than an adhesion strength between the continuous material layer 3 and release layer 4 without exposure to the light 6 and at least 10% lower after exposure to the light pattern 6t. More preferably, said margin is at least 20%, even more preferably at least 30%, most preferably at least 50%. The higher the margin, the better the selectivity of the continuous material layer 3 sticking to either the transparent layer 1 or the release layer 4 depending on exposure to the light pattern 6t. Of course, the relative margin does not have to be the same, e.g. adhesion between layers 1 and 3 can be 10% higher before exposure and 20% lower after exposure than adhesion between layers 3 and 4.

In one embodiment, the continuous material layer 3 has a layer thickness of less than 1000 nm, preferably less than 500 nm, even more preferably less than 250 nm. It will be appreciated that shear forces during tearing can be lower for a thinner continuous material layer 3. Accordingly, the margin of adhesion change caused by the light pattern 6t can be lower. Furthermore, preferably, the processes described herein are performed roll-to-roll or roll-to-sheet. Accordingly, preferably, the stack including the continuous material layer 3 is flexible, e.g. comprising a transparent polymer layer. However, the process is not limited to flexible substrates, e.g. the transparent layer 1 may alternatively comprise a glass substrate.

Preferably, a light has sufficient total energy to cause the changing adhesion. In one embodiment, an energy of at least 5 Joule per square centimeter ($J/cm^2$) is be used to sufficiently release the adhesion between the transparent layer and continuous material layer. On the other hand, preferably, the energy is not so much that it damages the substrate. Accordingly, in one embodiment, an energy of less than 20 $J/cm^2$ is used. For example, a preferably range can be between 10 and 15 $J/cm^2$.

Preferably, energy is delivered to the stack in the form of a light pulse. In one embodiment, the light is provided as a short pulse, e.g. preferably shorter than 2 ms (millisecond), more preferably shorter than 1 ms, e.g. between 1 µs and 2000 µs. The shorter the light pulse, the higher its intensity. Higher light intensities may correspond to better reactivity of the adhesive material to the light. On the other hand, too high intensities may damage the stack.

Preferably, the light source 5 comprises a flash lamp, e.g. a Xenon (Xe) flash lamp can provide a relatively high luminance. It will be appreciated that moderately short light pulses (e.g. 10 µs to 10 ms) having desired energies (e.g. around 12 $J/cm^2$) can be advantageously produced using a flash lamp. It will also be appreciated that a flash lamp is typically less complicated and/or expensive than a corresponding laser system. Some flash lamps may also provide shorter light pulses, e.g. lower than 30 µs.

Preferably, the mask 7 is able to withstand the light energy and intensity without damage. In one embodiment, the mask comprises a patterned metal on glass. Suitable metals for the mask may include aluminium or chrome. The mask can be for example transmissive or reflective. To pattern the light, preferably the mask is arranged in a uniform light beam. Optionally light of the light source (e.g. flash lamp) is collimated before impinging the mask.

In one embodiment, the methods and systems described herein may result in a substrate 20 comprising a transparent layer 1, wherein a patterned material 3p is adhered to the transparent layer 1 by means of an adhesion layer 2 therein between. In the embodiment, parts 2r of the adhesion layer 2 are decomposed and/or melted at locations R where the patterned material 3p has been removed. Also other signs of reaction may be present at the locations R, e.g. melting/solidifying of the surface of the transparent layer 1. In one embodiment, the substrate 20 does not comprise a separate intermediate adhesion layer 2, e.g. the continuous material layer 3 is deposited directly onto the transparent layer 1. Still there can be signs of reaction at the locations R related to the release of adhesion by the light pattern 6t as said locations. In one embodiment the patterned material 3p comprises a tearing edge resulting from the removing of material 3r at the said locations R by means of pulling a release layer 4 off a continuous material layer 3 that is selectively adhered to the transparent layer 1. The tearing edge may be formed at the position S where the shear forces act between the patterns 3r and 3p at the moment of pulling the release layer 4.

Figure 3:
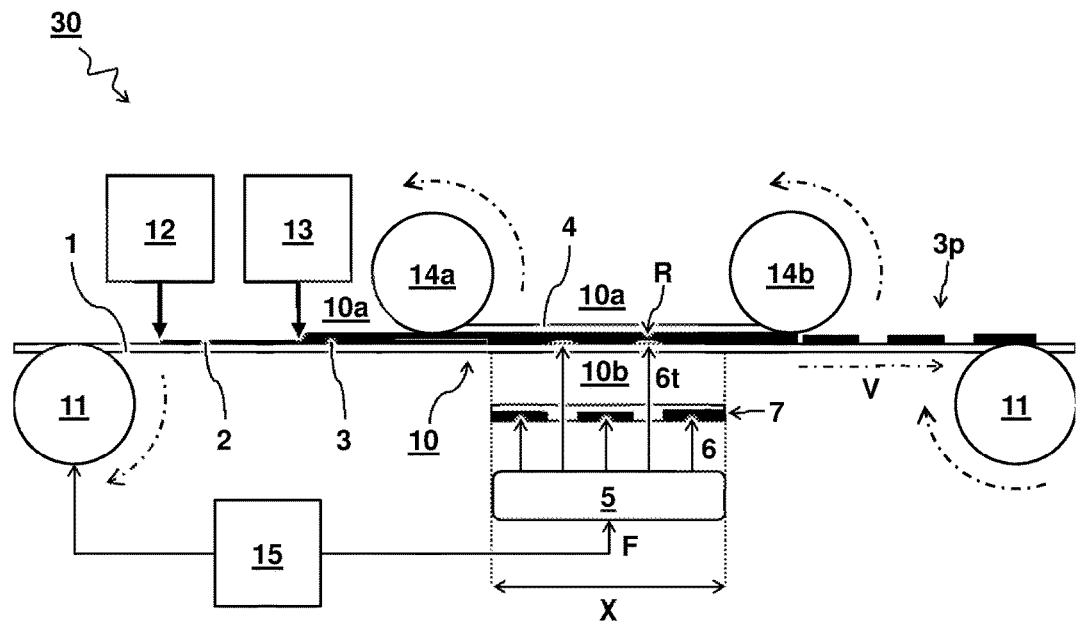
FIG. 3 schematically illustrates a system for forming a patterned structure on a substrate.

FIG. 3 shows a system 30 for forming a patterned structure on a substrate. The system comprises means 11,12, 13,14 for providing a stack 10. The stack 10 comprises a continuous material layer 3 adhered between a release layer 4 on one side 10a and a transparent layer 1 on the other side 10b. A light source 5 is arranged for projecting light 6 onto the stack 10 from the side 10b of the transparent layer 1. A mask 7 is arranged between the light source 5 and the stack 10 to pattern the projected light 6 onto the stack 10. The light pattern 6t is projected through the transparent layer 1 to cause a patterned release of adhesion between the continuous material layer 3 and the transparent layer 1 at locations R matching the projected light pattern 6t.

In the embodiment shown, a release layer separator 14b is arranged in a processing sequence after the light source 5 for separating the release layer 4 from the transparent layer 1. A pattern 3p formed in the continuous material layer 3 adheres to the transparent layer 1 at locations "A" where the adhesion between the continuous material layer and the transparent layer was not released by the projected light pattern 6t. A reciprocal pattern 3r formed in the continuous material layer 3 adheres to the release layer 4 at locations A' where the adhesion between the continuous material layer 3 and the transparent layer 1 was released R by the projected light pattern 6t.

In one embodiment, the system 30 comprises a substrate transporter 11 arranged for transporting a substrate comprising the transparent layer 1 along a path defining a processing sequence. In one embodiment, the substrate transporter 11 comprises one or more rollers to carry, guide and/or transport the substrate. Optionally, the base substrate (e.g. comprising the transparent layer 1) is provided from a storage roll. Optionally, the substrate with patterned material 3p can be stored again on a roll or cut into sheets.

In one embodiment, the system 30 comprises material deposition means 13 arranged for depositing the continuous material layer 3 on one side 10a of the substrate opposite the other side 10b of the substrate to be irradiated by the light source 5. In one embodiment, the material deposition means 13 comprises a material supply that is, in use, filled with the material to be patterned for forming the continuous material layer. For example, the material deposition means may comprise a supply with metal to form the continuous material layer 3. The deposition means may e.g. comprise evaporation or sputtering means for applying the metal layer. In one embodiment, the system comprises material supply means comprising a metal or semi-conductor material to be deposited as the continuous material layer 3 and material deposition means 13 arranged for depositing the continuous material layer 3 on the substrate.

In one embodiment, the system 30 comprises a release layer applicator 14a arranged in sequence between the deposition means 13 and the light source 5 for laminating the release layer 4 onto the continuous material layer 3. In one embodiment, the release layer applicator 14a comprises a release liner on a roll, e.g. sticky tape. The release layer separator 14b may also comprise roll to pull the release liner from the rest of the stack 10

In one embodiment, the system comprises adhesion deposition means 12 arranged for depositing the intermediate adhesion layer 2 in sequence before the material deposition means 13 and on the same side 10a as the material deposition means 13. In one embodiment, the adhesion deposition means 12 comprises an adhesion supply that is, in use, filled with the adhesion material for forming the intermediate adhesion layer 2. For example, the adhesion supply may comprise a supply with polymer adhesion layer precursor to form the intermediate adhesion layer 2. The adhesion deposition means 12 may e.g. comprise a slot die coater for applying the adhesion layer 2.

In one embodiment, the system comprises a controller 15 arranged for controlling a pulse frequency "F" of the light source 5 and a displacement "V" of the substrate by the substrate transporter 11 through the projected light pattern 6t of the light source 11. In one embodiment, the controller 15 is programmed to displace the substrate between light pulses over a distance "X" larger than the projected light pattern 6t to cause the patterned release of adhesion by a single light pulse. In one embodiment, the substrate transporter 11 is arranged to move the substrate with a constant velocity. In another embodiment, the substrate transporter 11 is arranged to move the substrate with an intermittent velocity, e.g. slowing down or stopping when the light pulse in projected. In one embodiment, the light source 5 comprises a flash lamp to provide the light pulse.

In one embodiment, the continuous material layer 3 does not react (e.g. chemically) to the projected light. This can have an advantage, that the material to be patterned is not affected, e.g. degraded by the light. In one embodiment, the light may react only with the adhesion layer, which is separate from the continuous material layer Of course also other processing steps may be provided before, during, in between, and/or after the shown processing steps. For example, after manufacture of the patterned structure, electric components can be placed on the substrate.

In a specific embodiment, one or more of the following components are provided:
  Light source: Xenon flash lamp. High energy and short pulses (<<1 ms) preferred for optimal results.
  Mask: Photolithographed metal on glass. Aluminium or chrome to reduce the light absorption and the chance of ablation. Instead of a transmission based mask, also reflection based masks can be used
  Substrate: Transparent for the emitted light. Polymer film or glass (polymer adhesion layer preferred when using a glass substrate)
  Polymer adhesion layer: Increase the adhesion from the substrate to the evaporated/sputtered metal. When removing the residual metal by means of the release liner, the non-ablated metal may not be pulled off.
  Metal(s): A thin metal layer is e.g. evaporated of sputtered onto the substrate. Copper is a good candidate as it absorbs a lot of the emitted light. More reflective metals may benefit from an additional absorbing layer (e.g. carbon) in order to generate the high peak temperature.
  Release liner: Polymer film which removes the residual metal after ablation.

Figure 4:
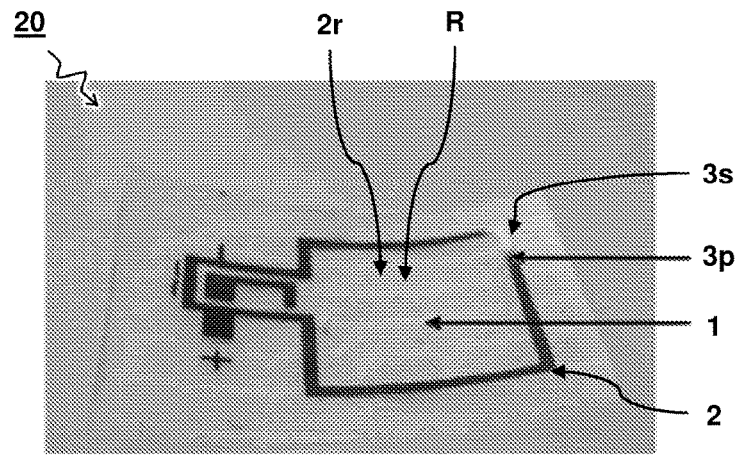
FIG. 4 shows a photograph of a resulting substrate with patterned structure thereon.

In one embodiment, the following configuration is used:
Lamp equipment: Xenon Sinteron® 2000
Pulse: 1.5 ms, ~12 J/cm2, 1 pulse
Mask: Chromium (100 nm) on borosilicate glass (0.7 mm)
Substrate: PET, 80 μm
Metal: Evaporated copper, 200 nm
Release liner: Blue sticky tape FIG. 4 shows a photograph of a substrate 10 with a patterned layer 3p thereon. This figure demonstrates that the current methods and systems are particularly useful for providing an electrical circuit pattern on a substrate, e.g. a flexible substrate. The substrate 20 results from a method and system as described herein. The substrate 20 typically comprising a transparent layer 1, wherein a patterned material 3$p$ is adhered to the transparent layer 1. Typically the patterned material 3$p$ comprises a tearing edge 3$s$. The tearing edge 3$s$ may result from the removing of material 3$r$ at the said locations R by the pulling a release layer 4 off the continuous material layer 3. The edge roughness may be dependent on the thickness of the material layer 3, e.g. having a root mean square higher than 10% of the layer thickness. For example, a layer of 200 nm copper typically has a tearing edge with a roughness of higher than 20 nm. In one embodiment, as shown, wherein the patterned continuous material layer (3$p$) forms conductive tracks of the circuit pattern.

One aspect of the present disclosure concerns a method for forming a patterned structure on a substrate, the method comprising providing a stack comprising a continuous material layer adhered between a transparent layer and a release layer; providing a light source projecting light onto the stack from a side of the transparent layer; providing a mask between the light source and the stack to pattern the projected light onto the stack, wherein the light pattern is projected through the transparent layer to cause a patterned release of adhesion between the continuous material layer and the transparent layer. Another further aspect of the present disclosure concerns a system for forming a patterned structure on a substrate on a substrate, the system comprising means for providing a stack comprising a continuous material layer adhered between a transparent layer and a release layer; a light source for projecting light onto the stack from a side of the transparent layer; and a mask between the light source and the stack to pattern the projected light onto the stack, wherein the light pattern is projected through the transparent layer to cause a patterned release of adhesion between the continuous material layer and the transparent layer.

While example embodiments were shown for providing a patterned layer on a substrate, also alternative ways may be envisaged by those skilled in the art having the benefit of the present disclosure for achieving a similar function and result. E.g. components or layers may be combined or split up. The various elements of the embodiments as discussed and shown offer certain advantages, such as providing large area patterning of metal, oxide or organic layers on flexible substrates. Of course, it is to be appreciated that any one of the above embodiments or processes may be combined with one or more other embodiments or processes to provide even further improvements in finding and matching designs and advantages. It is appreciated that this disclosure offers particular advantages to role-to-role processing, and in general can be applied for any application wherein patterned layers of any kind or composition are to be formed on a substrate.

While the present systems and methods have been described in particular detail with reference to specific exemplary embodiments thereof, it should also be appreciated that numerous modifications and alternative embodiments may be devised by those having ordinary skill in the art without departing from the scope of the present disclosure. For example, embodiments wherein devices or systems are disclosed to be arranged and/or constructed for performing a specified method or function inherently disclose the method or function as such and/or in combination with other disclosed embodiments of methods or systems. Furthermore, embodiments of methods are considered to inherently disclose their implementation in respective hardware, where possible, in combination with other disclosed embodiments of methods or systems. Furthermore, methods that can be embodied as program instructions, e.g. on a non-transient computer-readable storage medium, are considered inherently disclosed as such embodiment.

Finally, the above-discussion is intended to be merely illustrative of the present systems and/or methods and should not be construed as limiting the appended claims to any particular embodiment or group of embodiments. The specification and drawings are accordingly to be regarded in an illustrative manner and are not intended to limit the scope of the appended claims. In interpreting the appended claims, it should be understood that the word "comprising" does not exclude the presence of other elements or acts than those listed in a given claim; the word "a" or "an" preceding an element does not exclude the presence of a plurality of such elements; any reference signs in the claims do not limit their scope; several "means" may be represented by the same or different item(s) or implemented structure or function; any of the disclosed devices or portions thereof may be combined together or separated into further portions unless specifically stated otherwise. The mere fact that certain measures are recited in mutually different claims does not indicate that a combination of these measures cannot be used to advantage. In particular, all working combinations of the claims are considered inherently disclosed.

The invention claimed is:

1. Method for forming an electrical circuit pattern on a substrate, the method comprising
    providing a stack comprising a continuous material layer adhered between a release layer on one side and a transparent layer on the other side, wherein the continuous material layer is a homogeneous layer of a metal or a semiconductor material;
    providing a light source projecting light onto the stack from the side of the transparent layer; and
    providing a mask between the light source and the stack to form a light pattern in the light projected from the light source onto the stack, wherein the light pattern is projected through the transparent layer to cause a patterned release of adhesion between the continuous material layer and the transparent layer at locations matching the light pattern.

2. Method according to claim 1, further comprising separating the release layer from the transparent layer, wherein
    a pattern formed in the continuous material layer adheres to the transparent layer at locations where adhesion between the continuous material layer and the transparent layer was not released by the light pattern, and
    a reciprocal pattern formed in the continuous material layer adheres to the release layer at locations where adhesion between the continuous material layer and the transparent layer was released by the light pattern.

3. Method according to claim 2, wherein the electrical circuit pattern is the pattern formed in the continuous material layer that adheres to the transparent layer.

4. Method according to claim 2, wherein the pattern formed in the continuous material layer comprises conductive tracks of the electrical circuit pattern.

5. Method according to claim 1, wherein the mask comprises an image of the electrical circuit pattern.

6. Method according to claim 1, wherein the stack further comprises an intermediate adhesion layer between the transparent layer and the continuous material layer.

7. Method according to claim 6, wherein the patterned release of adhesion between the continuous material layer and the transparent layer is caused by a selective reaction of the intermediate adhesion layer.

8. Method according to claim 6, wherein the continuous material layer does not react to the projected light.

9. Method according to claim 1, wherein the light pattern projected through the transparent material of the stack causes the continuous material layer to indirectly heat the transparent material or an adjacent transparent layer, to cause the patterned release of adhesion.

10. Method according to claim 1, wherein the light source comprises a flash lamp.

11. The method of claim 1, wherein the continuous material layer is a homogeneous metal layer.

12. A method for forming an electrical circuit pattern on a substrate, the method comprising
    providing a stack comprising a continuous material layer adhered between a release layer on one side and a transparent layer on the other side, wherein the continuous material layer is a continuous metal layer or continuous semiconductor material layer;
    providing a light source projecting light onto the stack from the side of the transparent layer; and
    providing a mask between the light source and the stack to form a light pattern in the light projected from the light source onto the stack, wherein the light pattern is projected through the transparent layer to cause a patterned release of adhesion of the continuous material layer from the transparent layer at locations matching the light pattern,
wherein the patterned release of adhesion of the continuous material layer from the transparent layer is caused by a selective reaction, at the locations matching the light pattern, of an adhesion layer.

13. The method of claim 12, wherein the selective reaction is a selective decomposition of the adhesion layer.

14. The method of claim 12, wherein the adhesion layer is part of the transparent layer.

15. The method of claim 12, wherein the adhesion layer is a separate layer between the transparent layer and the continuous layer.

16. The method of claim 12, further comprising separating the release layer from the transparent layer, to cause separation of the continuous material layer into the electrical circuit pattern and a reciprocal pattern.

17. The method of claim 12, wherein the light projected from the light source does not cause a reaction of the continuous material layer.

18. A method for forming an electrical circuit pattern on a substrate, the method comprising
    providing a stack comprising a continuous material layer adhered between a release layer on one side and a transparent layer on the other side, wherein the continuous material layer comprises a conductor or semiconductor material;
    providing a light source projecting light onto the stack from the side of the transparent layer; and
    providing a mask between the light source and the stack to form a light pattern in the light projected from the light source onto the stack, wherein the light pattern is projected through the transparent layer to cause a patterned release of adhesion between the continuous material layer and the transparent layer at locations matching the light pattern,
wherein the light projected from the light source does not cause a reaction of the continuous material layer and wherein the patterned release of adhesion causes, upon separating the release layer from the transparent layer, separation of the continuous material layer into the electrical circuit pattern, said electrical circuit pattern being formed of conductive tracks of the continuous material layer.

19. The method of claim 18, wherein the patterned release of adhesion between the continuous material layer and the transparent layer is caused by a selective reaction, at the locations matching the light pattern, of an adhesion layer.

20. The method of claim 19, wherein the adhesion layer is a separate layer between the transparent layer and the continuous layer.

* * * * *